(12) United States Patent
Wong et al.

(10) Patent No.: US 9,989,587 B2
(45) Date of Patent: Jun. 5, 2018

(54) APPARATUS FOR TESTING MULTIPLE SEMICONDUCTOR DICE WITH INCREASED THROUGHPUT

(71) Applicant: ASM Technology Singapore Pte Ltd, Singapore (SG)

(72) Inventors: Yam Mo Wong, Singapore (SG); Kui Kam Lam, Kwai Chung (HK); Kai Siu Lam, Kwai Chung (HK); Ka Wai Chan, Kwai Chung (HK)

(73) Assignee: ASM TECHNOLOGY SINGAPORE PTE LTD, Singapore (SG)

( * ) Notice: Subject to any disclaimer, the term of this patent is extended or adjusted under 35 U.S.C. 154(b) by 278 days.

(21) Appl. No.: 14/708,380

(22) Filed: May 11, 2015

(65) Prior Publication Data
US 2016/0334464 A1 Nov. 17, 2016

(51) Int. Cl.
*G01R 31/308* (2006.01)
*G01R 31/28* (2006.01)
(52) U.S. Cl.
CPC ..... *G01R 31/2887* (2013.01); *G01R 31/2891* (2013.01)

(58) Field of Classification Search
CPC .................. G01R 31/2887; G01R 31/2891
USPC ....................... 324/750.19, 750.23
See application file for complete search history.

(56) References Cited

U.S. PATENT DOCUMENTS

| | | | |
|---|---|---|---|
| 2007/0096763 A1* | 5/2007 | Ehrmann | G01R 31/2891 324/750.23 |
| 2013/0093441 A1* | 4/2013 | Tonini | H01L 22/14 324/693 |

* cited by examiner

*Primary Examiner* — Farhana Hoque
(74) *Attorney, Agent, or Firm* — Ostrolenk Faber LLP

(57) ABSTRACT

A die tester comprising a testing table on which a plurality of dice arranged in an array are mountable, and a first probe and a second probe that are adjustable to a fixed position with a fixed separation distance between the first probe and the second probe. The fixed position corresponds to predetermined test points on the plurality of dice, and the testing table and the first and second probes are movable relative to each other so as to position test points of a first die of the plurality of dice to the first probe and the second probe for testing the first die. The die tester further comprises movable third and fourth probes that are movable relative to each other and positionable to test points on a second die of the plurality of dice for testing the second die.

17 Claims, 7 Drawing Sheets

APPARATUS FOR TESTING MULTIPLE SEMICONDUCTOR DICE WITH INCREASED THROUGHPUT

FIELD OF THE INVENTION

The invention relates to semiconductor die testing, such as light-emitting diode (LED) die testing.

BACKGROUND

Testing is needed in semiconductor manufacturing to ensure that a device under test (DUT) meets the required specifications and performs as intended. Since defects may arise during semiconductor manufacturing, the good devices need to be sorted from the bad and testing assures device quality.

A probing machine is used in the testing of electrical and optical properties of semiconductor chips or dice. The probing machine tests dice one at a time, by using two probes to contact test points on a die, for example an LED die, to perform the testing on the die. Manufacturers usually desire faster testing in order to improve throughput and thus decrease manufacturing costs and increase profits.

SUMMARY OF THE INVENTION

It is thus an object of the invention to seek to provide a die tester and a method of die testing which increases throughput as compared to the prior art.

According to a first aspect of the present invention, there is provided a die tester comprising:
  a testing table on which a plurality of dice arranged in an array are mountable;
  a first probe and a second probe that are adjustable to a fixed position with a fixed separation distance between the first probe and the second probe, wherein the fixed position corresponds to predetermined test points on the plurality of dice; and
  wherein the testing table and the first and second probes are movable relative to each other so as to position test points of a first die of the plurality of dice to the first probe and the second probe for testing the first die;
  movable third and fourth probes that are movable relative to each other and positionable to test points on a second die of the plurality of dice for testing the second die.

According to a second aspect of the present invention, there is provided a method of die testing comprising the steps of:
  mounting a plurality of dice arranged in an array on a testing table;
  adjusting a first probe and a second probe to a fixed position with a fixed separation distance between the first probe and the second probe, wherein the fixed position corresponds to predetermined test points on the plurality of dice;
  positioning test points of a first die of the plurality of dice to the first and second probes;
  positioning movable third and fourth probes to test points on a second die of the plurality of dice;
  testing the first die; and
  testing the second die.

These and other features, aspects, and advantages will become better understood with regard to the description section, appended claims, and accompanying drawings.

BRIEF DESCRIPTION OF THE DRAWINGS

Embodiments of the present invention will now be described, by way of example only, with reference to the accompanying drawings, in which.

In the drawings, like parts are denoted by like reference numerals.

DETAILED DESCRIPTION

Figure 1:
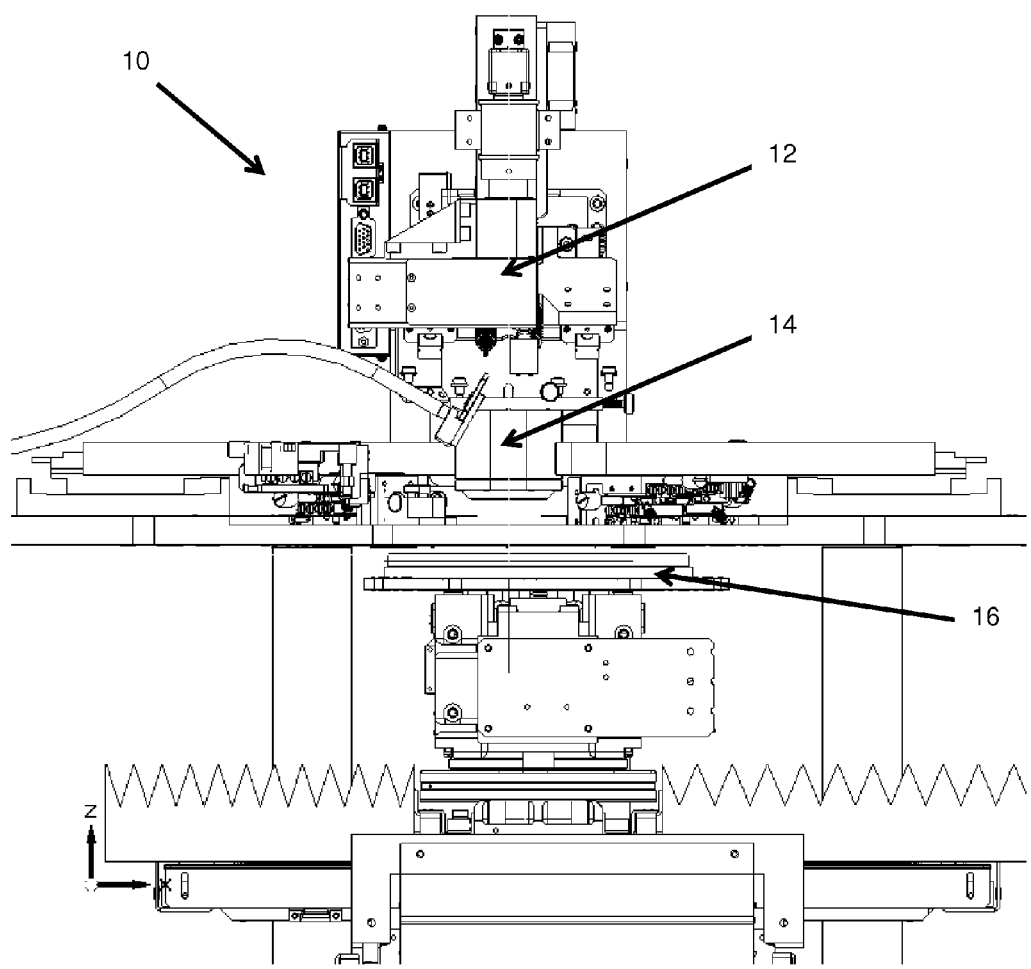
FIG. 1 shows a front view of a die tester comprising a dual-die probe head system.

FIG. 1 is a front view of a die tester 10 comprising a dual-die probe head system according to the preferred embodiment of the present invention. The dual-die probe head system comprises an image capturing device, such as a vision system 12, and a light detector 14, such as an integrated sphere, positioned above a testing table or workpiece positioning table 16. The vision system 12 is configured to capture an image of a workpiece, such as a plurality of LED dice 30 to be tested by the die tester 10. The plurality of LED dice 30 may be arranged in an array, although other configurations are possible. Based on the image captured by the vision system 12, a computer processor (not shown) determines the positions of each of the plurality of LED dice 30, and the workpiece positioning table 16 positions each of the plurality of LED dice 30 based on the positions of the plurality of LED dice 30 as determined by the computer processor. The light detector 14 is configured to detect the light emitted from each of the plurality of LED dice 30 undergoing testing.

Figure 2:
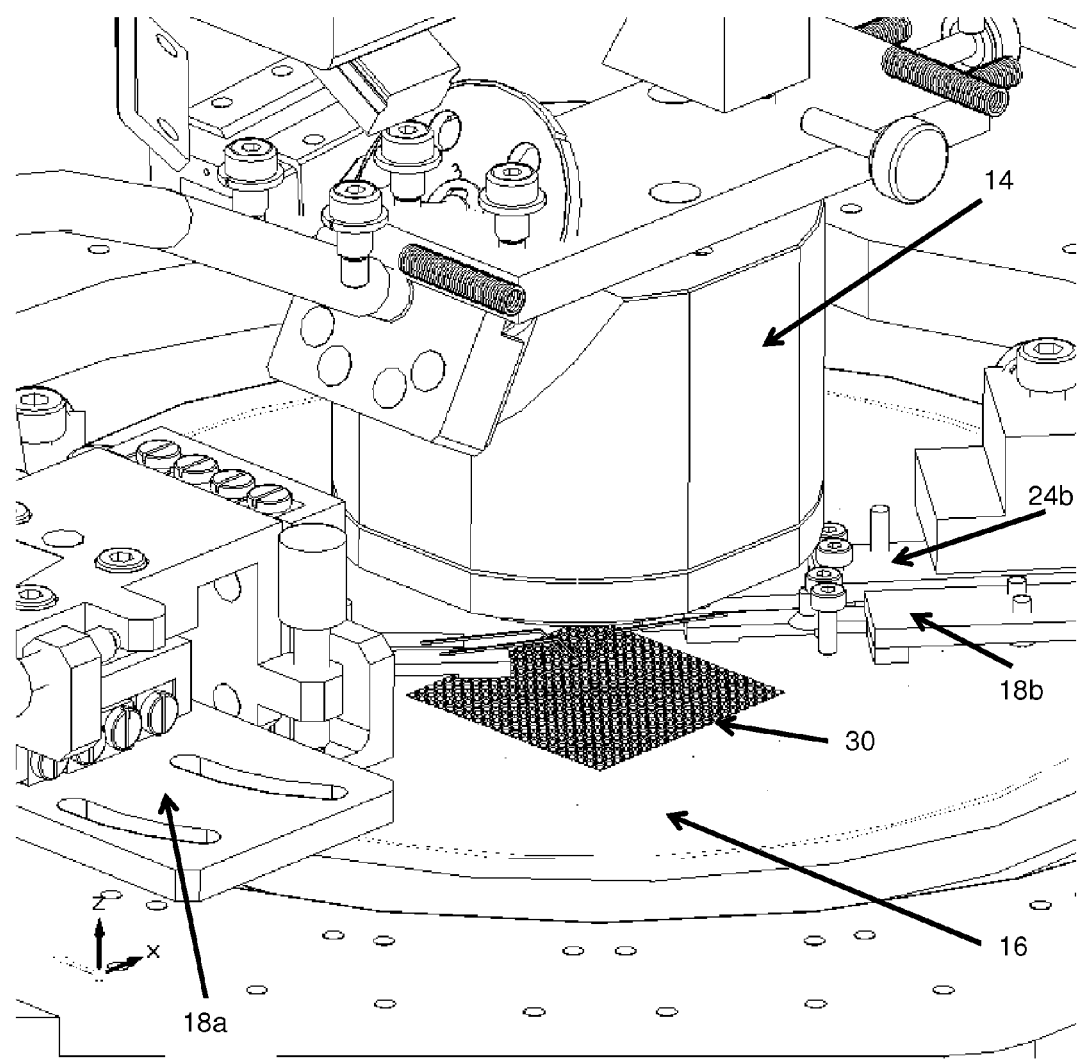
FIG. 2 shows a perspective view of the die tester of FIG. 1.

FIG. 2 is a perspective view of the die tester 10. The plurality of LED dice 30 to be tested by the die tester 10, is placed on the workpiece positioning table 16. Adjustable mounts, such as manually adjustable probe positioning tables 18a, 18b, are located substantially vertically above the plurality of LED dice 30, and substantially vertically below the light detector 14. The manually adjustable probe positioning tables 18a, 18b may both be movable on a same plane or each on a different plane. Movable probe positioning tables 24a, 24b are located adjacent to the manually adjustable probe positioning tables 18a, 18b. The movable probe positioning tables 24a, 24b may both be movable on a same plane or each on a different plane. The manually adjustable probe positioning tables 18a, 18b and the movable probe positioning tables 24a, 24b are mounted on a platform 32.

Figure 3:
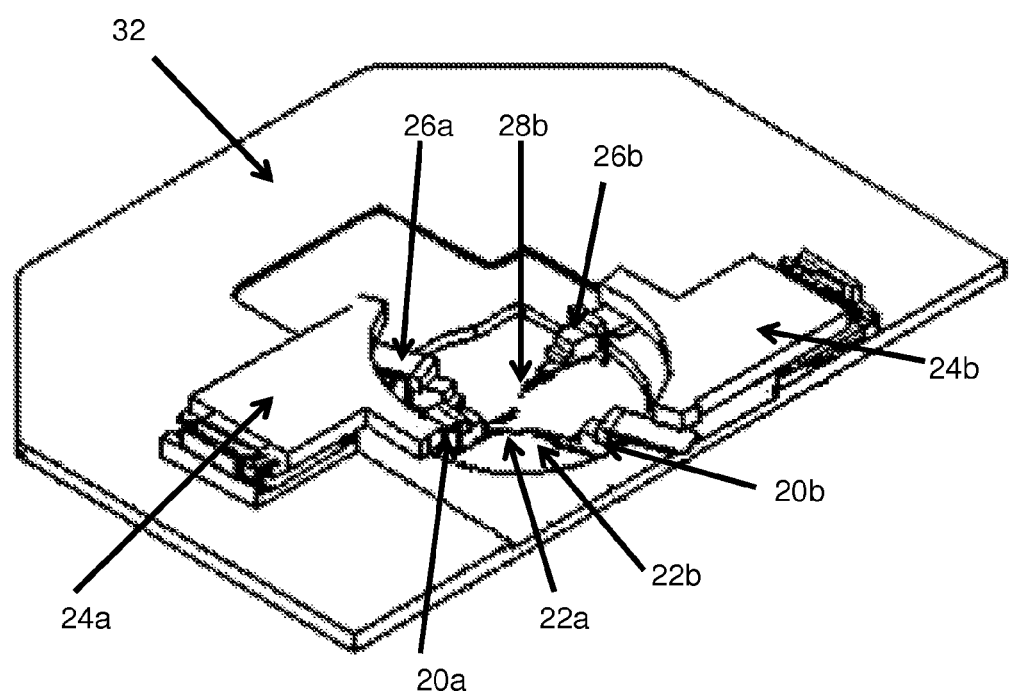
FIG. 3 shows a perspective view of motorized probe positioning tables mounted onto a platform.

FIG. 3 is a perspective view of the movable probe positioning tables 24a, 24b mounted onto the platform 32. Each of the manually adjustable probe positioning tables 18a, 18b comprises a respective manually adjustable probe head 20a, 20b, and each of the manually adjustable probe heads 20a, 20b has a respective manual probe 22a, 22b extending downwards towards the workpiece positioning table 16. Each of the manual probes 22a, 22b is attached to the respective manually adjustable probe head 20a, 20b, and each of the manually adjustable probe heads 20a, 20b is attached to the respective manually adjustable probe positioning table 18a, 18b, such that each of the manual probes 22a, 22b is operatively connected to the respective manually adjustable probe positioning table 18a, 18b. The manually adjustable probe positioning tables 18a, 18b, which are mounted on the platform 32, are movable in an XY plane. The manually adjustable probe positioning tables 18a, 18b may be manually moved in the XY plane, to adjust the positions of the manually adjustable probe heads 20a, 20b and the manual probes 22a, 22b.

Each of the movable probe positioning tables 24a, 24b comprises a respective movable probe head 26a, 26b, and each of the movable probe heads 26a, 26b has a respective movable probe 28a, 28b extending downwards towards the workpiece positioning table 16. Each of the movable probes 28a, 28b is attached to the respective movable probe head 26a, 26b, and each of the movable probe heads 26a, 26b is attached to the respective movable probe positioning table 24a, 24b, such that each of the movable probes 28a, 28b is operatively connected to the respective movable probe positioning table 24a, 24b. Each of the movable probe positioning tables 24a, 24b comprises an XY table. The dual-die probe head system controls the XY table to move the respective movable probe head 26a, 26b and the respective movable probe 28a, 28b in an XY plane. The probe positioning tables 18a, 18b, 24a, 24b may each be moved independently.

Figure 4:
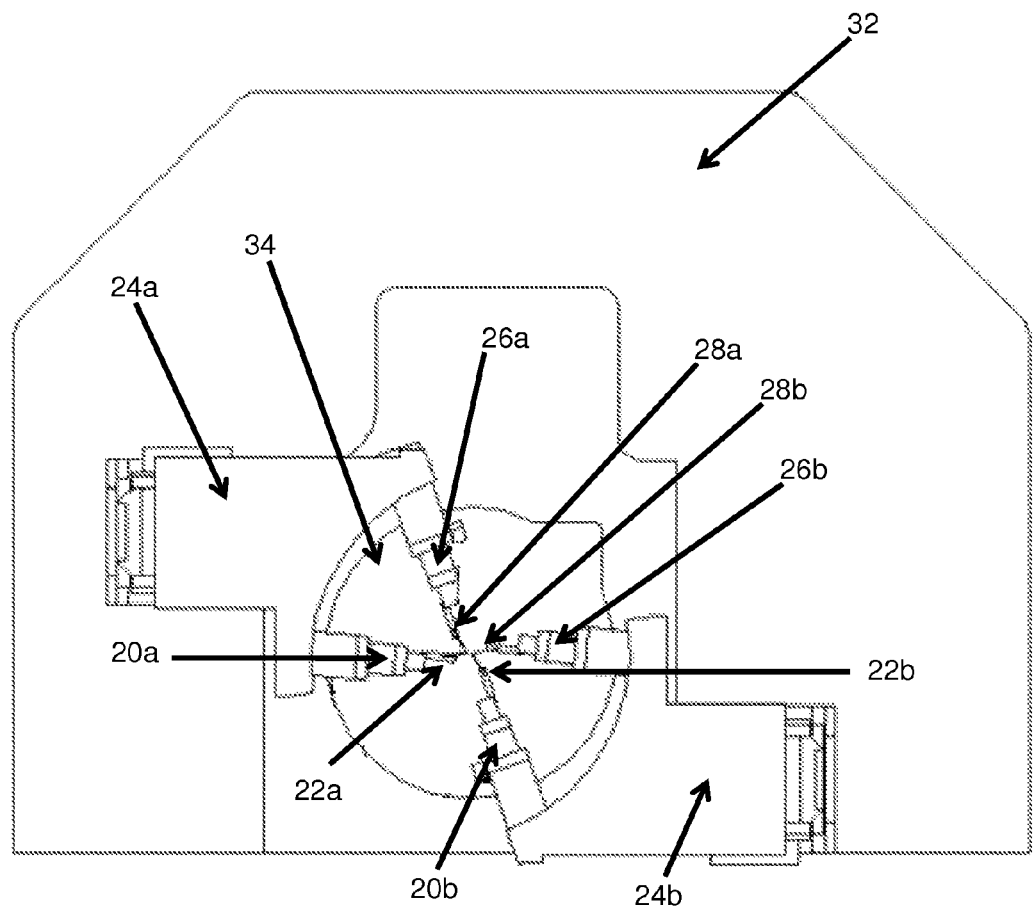
FIG. 4 shows the plan view of the platform of FIG. 3.

FIG. 4 is a plan view of the platform 32. The platform 32 has portions that define a through-hole 34, which may be generally circular, but other configurations are possible. The probe positioning tables 18a, 18b, 24a, 24b are mounted at positions at the circumference or perimeter of the through-hole 34, where the probe heads 20a, 20b, 26a, 26b and the probes 22a, 22b, 28a, 28b extend generally towards the centre of the through-hole 34. The through-hole 34 allows the probes 22a, 22b, 28a, 28b to reach and contact the plurality of LED dice 30, allows the vision system 12 to view the plurality of LED dice 30, and allows the light detector 14 to detect the light emitted from each of the plurality of LED dice 30 undergoing testing.

Figure 5:
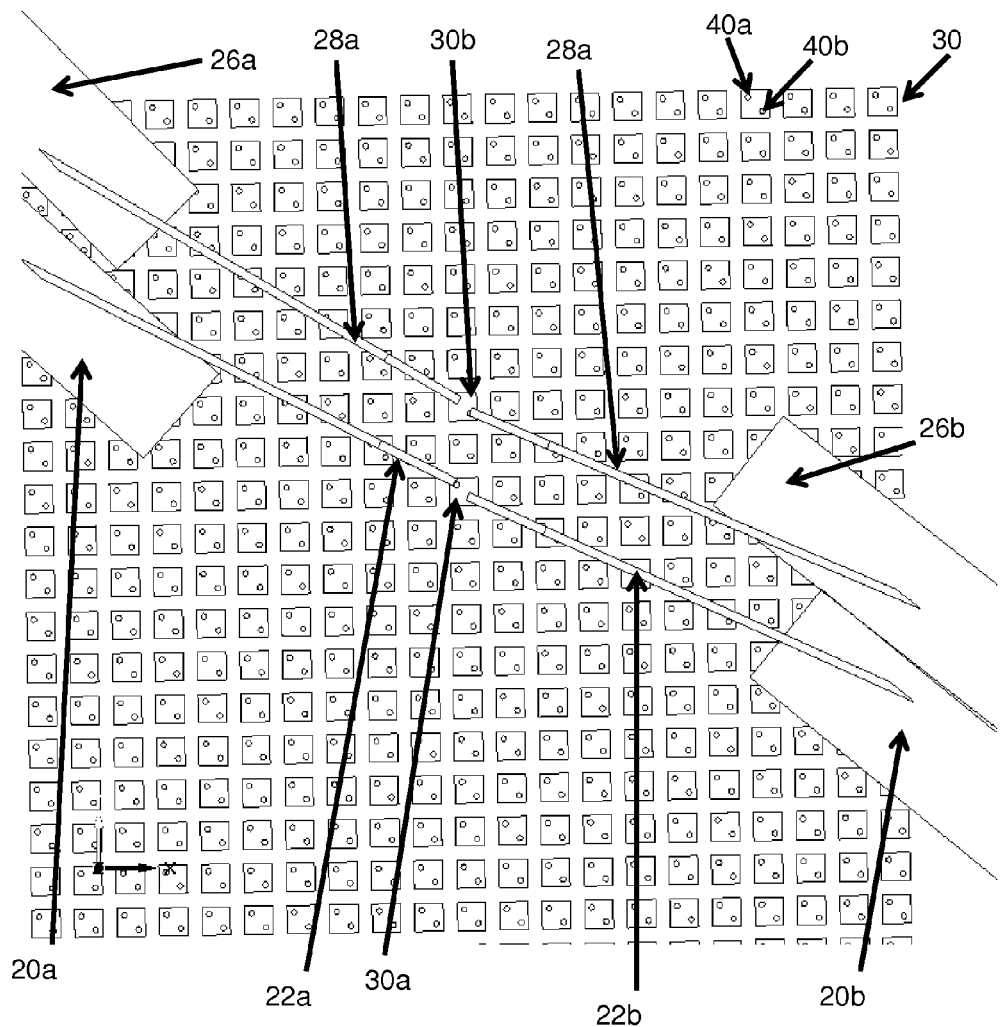
FIG. 5 shows a plurality of LED dice undergoing testing.

FIG. 5 shows the plurality of LED dice 30 undergoing testing. Each of the plurality of LED dice 30 comprises two test points 40a, 40b, for example electrical poles. In use, the vision system 12 will take the image of the plurality of LED dice 30 placed on the workpiece positioning table 16. Based on the image captured by the vision system 12, the computer processor (not shown) determines the positions of each of the plurality of LED dice 30 and the respective test points 40a, 40b.

Figure 6A:
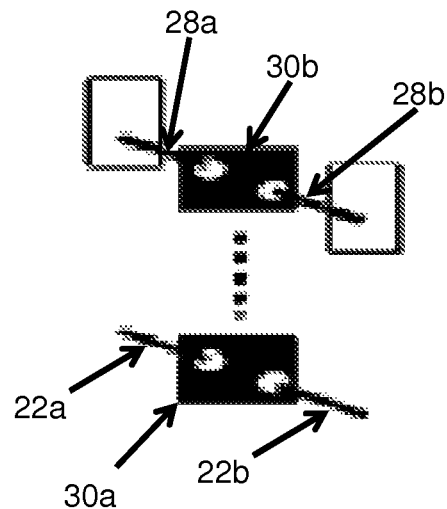
FIGS. 6A-6D show a testing process for the plurality of LED dice.

FIGS. 6A-6D show a testing process for the plurality of LED dice 30 according to the preferred embodiment of the present invention. In FIG. 6A, an operator manually moves or adjusts the manual probes 22a, 22b into a fixed position to contact the test points 40a, 40b of a first LED die 30a. In the fixed position, there is a fixed separation distance between the manual probe 22a and the manual probe 22b, in which the fixed position of the manual probes 22a, 22b corresponds to predetermined test points 40a, 40b of the plurality of LED dice 30, which are arranged in an array. The manual probes 22a, 22b may remain fixed or stationary during testing.

The movable probe 28a is movable relative to the movable probe 28b. During testing, the movable probes 28a, 28b are positionable by the movable probe positioning tables 24a, 24b to contact the test points 40a, 40b of a second LED die 30b automatically. The separation distance or pitch between the corresponding test points 40a, 40b of the first LED die 30a and the second LED die 30b may be variable, but the separation distance is generally about 0.5 mm to about 2 mm. The first LED die 30a may be adjacent to the second LED die 30b, or there may one or more LED dice between the first LED die 30a and the second LED die 30b.

Figure 6B:
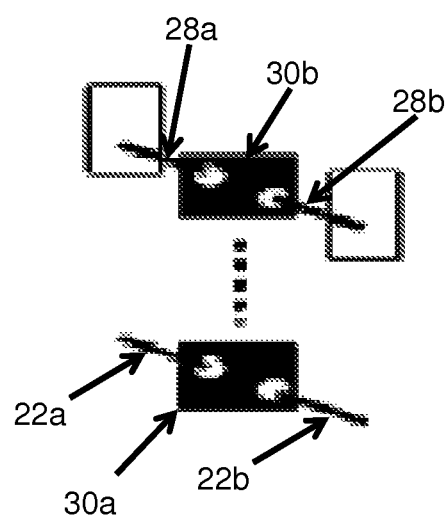

In FIG. 6B, the first LED die 30a is being tested. During testing, a current is passed from the manual probes 22a, 22b to the test points 40a, 40b of the first LED die 30a. If the first LED die 30a is working, the first LED die 30a will light up. The light detector 14 detects the light emitted from the first LED die 30a, and the computer processor analyzes the light detected by the light detector 14, and characterizes or grades the first LED die 30a. After testing the first LED die 30a, a current is passed from the movable probes 28a, 28b to the test points 40a, 40b of the second LED die 30b, to test the second LED die 30b. If the second LED die 30b is working, the second LED die 30b will light up. The light detector 14 detects the light emitted from the second LED die 30b, and the computer processor analyzes the light detected by the light detector 14, and characterizes or grades the second LED die 30b.

Figure 6C:
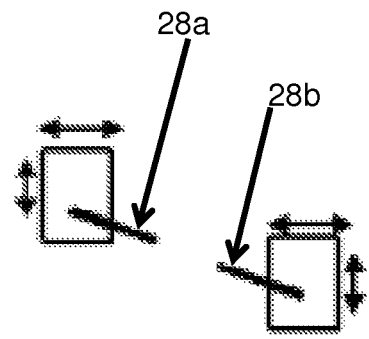
Figure 6C:
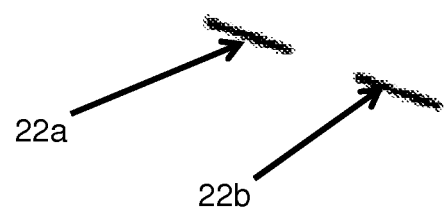

In FIG. 6C, the second LED die 30b has been tested. The manual probes 22a, 22b are movable relative to the workpiece positioning table 16. The workpiece positioning table 16 moves vertically downwards such that the probes 22a, 22b, 28a, 28b no longer contact the test points 40a, 40b of the first and second LED dice 30a, 30b. Then the workpiece positioning table 16 moves horizontally to position or align a third LED die 30c below the manual probes 22a, 22b, based on the image taken by the vision system 12 and the position of the third LED die 30c determined by the computer processor (not shown). The test points 40a, 40b of the third LED die 30c are directly below, although not contacting, the manual probes 22a, 22b.

Based on the image taken by the vision system 12 and the position of the fourth LED die 30c determined by the computer processor, the movable probe positioning tables 24a, 24b move to position the movable probes 28a, 28b directly above, although not contacting, the test points 40a, 40b of a fourth LED die 30d. An advantage of using the movable probes 28a, 28b in this manner, is that two dice may be tested upon every single movement of the workpiece positioning table 16, even when there are variations in the test point pitch, position, or dimension of each of the plurality of LED dice 30.

Figure 6D:
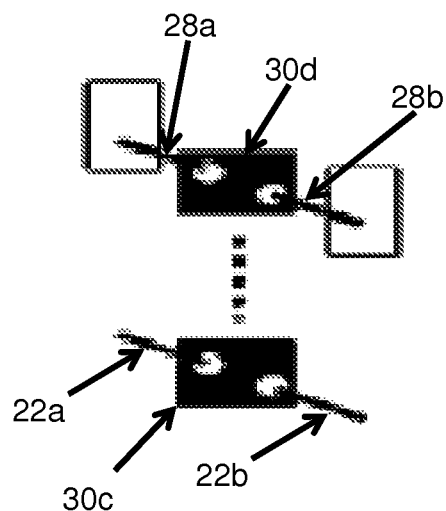

In FIG. 6D, the workpiece positioning table 16 moves vertically upwards such that the probes 22a, 22b, 28a, 28b contact the respective test points 40a, 40b of the third and fourth LED dice 30c, 30d. The third LED die 30c is tested, followed by the fourth LED die 30d, as described above for the first LED die 30a and the second LED die 30b.

The previously described embodiments of the present invention have various advantages, including being able to test two LED dice with every single movement of the workpiece positioning table 16, thus saving time and increasing efficiency in order to increase machine throughput.

Although the present invention has been described in considerable detail with reference to certain embodiments, other embodiments are possible, for example more probes may be added.

The testing table and the first and second probes are movable relative to each other. The manual probes 22a, 22b may be fixed or remain stationary and the workpiece positioning table 16 movable, or the manual probes 22a, 22b may be movable and the workpiece positioning table 16 is fixed or remains stationary. Both the manual probes 22*a*, 22*b* and the workpiece positioning table 16 may also be movable.

Therefore, the spirit and scope of the appended claims should not be limited to the description of the embodiments contained herein.

The invention claimed is:

1. A die tester comprising:
a testing table on which a plurality of dice arranged in an array are mountable;
a first probe and a second probe that are adjustable relative to each other in a predetermined XY plane to a fixed position with a fixed separation distance between the first probe and the second probe, wherein the fixed position corresponds to predetermined test points on the plurality of dice; and
wherein the testing table and the first and second probes are movable relative to each other in said predetermined XY plane so as to position test points of a first die of the plurality of dice to the first probe and the second probe for testing the first die;
movable third and fourth probes that are movable relative to each other in said predetermined XY plane and positionable to test points on a second die of the plurality of dice for testing the second die.

2. The die tester of claim 1, further comprising:
an image capturing device configured to capture an image of the plurality of dice; and
a computer processor operative to determine the position of the test points on the plurality of dice based on the image captured by the image capturing device.

3. The die tester of claim 1, further comprising a first positioning table operatively connected to the third probe and a second positioning table operatively connected to the fourth probe.

4. The die tester of claim 3, wherein the first positioning table and the second positioning table are movable on a same plane.

5. The die tester of claim 3, further comprising a first adjustable mount operatively connected to the first probe and a second adjustable mount operatively connected to the second probe.

6. The die tester of claim 5, further comprising a platform on which the first positioning table and the second positioning table are mounted.

7. The die tester of claim 6, wherein the first and second adjustable mounts are mounted on the platform.

8. The die tester of claim 7, wherein:
the platform comprises a through-hole; and
the first positioning table, the second positioning table, the first adjustable mount, and the second adjustable mount are mounted at positions at a perimeter of the through-hole.

9. The die tester of claim 8, wherein the probes extend generally towards a centre of the through-hole.

10. The die tester of claim 1, wherein each of the third and fourth probes is configured to move independently of each other.

11. The die tester of claim 1, wherein the separation distance between corresponding test points of the first die and the second die is 0.5-2 mm.

12. The die tester of claim 1, wherein the testing table is movable to align the test points of the first die to the first probe and the second probe for testing the first die during relative motion between the testing table and the first and second probes.

13. The die tester of claim 12, wherein the first probe and the second probe do not move during relative motion between the testing table and the first and second probes.

14. A method of die testing comprising the steps of:
mounting a plurality of dice arranged in an array on a testing table;
adjusting a first probe and a second probe relative to each other in a predetermined XY plane to a fixed position with a fixed separation distance between the first probe and the second probe, wherein the fixed position corresponds to predetermined test points on the plurality of dice;
positioning test points of a first die of the plurality of dice to the first and second probes;
positioning movable third and fourth probes to test points on a second die of the plurality of dice by moving the movable third and fourth probes relative to each other in said predetermined XY plane;
testing the first die; and
testing the second die.

15. The method of claim 14, wherein the step of positioning the test points of the first die to the first and second probes comprises the step of:
moving the testing table to position the test points of the first die to the first probe and the second probe.

16. The method of claim 14, further comprising the step of capturing an image of the plurality of dice prior to positioning the test points of the plurality of dice to the respective probes.

17. The method of claim 16, further comprising the step of determining the positions of the test points on the plurality of dice based on the image captured by the image capturing device.

* * * * *